United States Patent [19]

Kang et al.

[11] Patent Number: 5,372,971

[45] Date of Patent: Dec. 13, 1994

[54] METHOD FOR FORMING VIA HOLE IN MULTIPLE METAL LAYERS OF SEMICONDUCTOR DEVICE

[75] Inventors: Mi Young Kang, Seoul; Gon Son, Kyoungki-Do; Jin Ki Jung, Pusan, all of Rep. of Korea

[73] Assignee: Hyundai Electronics Industries Co. Ltd., Kyoungki-Do, Rep. of Korea

[21] Appl. No.: 955,285

[22] Filed: Oct. 1, 1992

[30] Foreign Application Priority Data

Oct. 2, 1991 [KR] Rep. of Korea ............ 91-17245[U]

[51] Int. Cl.$^5$ ............................................. H01L 21/44
[52] U.S. Cl. ..................................... 437/195; 437/245
[58] Field of Search ............... 437/962, 105, 106, 195, 437/245, 228

[56] References Cited

U.S. PATENT DOCUMENTS 4,997,789  3/1991  Keller et al. .................. 437/192

FOREIGN PATENT DOCUMENTS 0040260  4/1981  Japan .................................. 437/195
0078552  4/1988  Japan .......................... 148/DIG. 105

*Primary Examiner*—Olik Chaudhuri
*Assistant Examiner*—C. Everhart
*Attorney, Agent, or Firm*—Morgan & Finnegan

[57] ABSTRACT

A method for forming a via hole in multiple metal layers of the semiconductor device is disclosed. In a via hole forming process of the semiconductor device, a barrier layer is formed beneath the photoresistive layer. Accordingly, the polymer residue formed on the metal-layer pattern and side wall of the via hole is prevented during the plasma etching process.

8 Claims, 3 Drawing Sheets

METHOD FOR FORMING VIA HOLE IN MULTIPLE METAL LAYERS OF SEMICONDUCTOR DEVICE

BACKGROUND OF THE INVENTION

1. Field of the Invention

The invention relates to a method for forming via holes of semiconductor devices, and more particularly, to a method for forming a via hole in multiple metal layers, in which a metal barrier layer is formed beneath a photoresistive layer for protecting undesired polymer residue remaining on the bottom and sidewall of a via hole.

2. Related Art

Generally, in VLSI chips, as the density of unit cell of the semiconductor memory device increase, the unit area required for forming the unit memory cell decreases. Accordingly, a multi-layer wiring technique is very important to manufacture a semiconductor memory device. Especially in multi-level wiring process for submicron, the planar topography of metal layers and stabilized resistance of metal via hole are required.

However, when the via hole is formed to expose the metal layer, for example, aluminum metal by the plasma etching method, a portion of the photoresistive layer used as a pattern mask remains on the surface of aluminum metal or side wall of the via hole during the etching process, to thereby form an undesired thin polymer by the sputtering effect. Next, after the completion of the photoresistive removal process or after organic solation removal process, the above mentioned polymer will remain.

Accordingly, the remaining polymer causes the topology and high resistance of via hole, thereby deteriorating the reliability of semiconductor device by not causing any contact between upper metal layer and lower metal layer.

Therefore, the object of the present invention is to provide a method for forming a via hole in multiple metal layers of the semiconductor device, in which a barrier layer as a diffusion protect metal which is formed beneath the photoresistive layer to thereby protect the formation of the polymer of the photoresistive layer when a via hole is formed.

The preceding objects should be construed as merely presenting a few of the more pertinent features and applications of the invention. Many other beneficial results can be obtained by applying the disclosed invention in a different manner or modifying the invention within the scope of the disclosure. Accordingly, other objects and a fuller understanding of the invention may be had by referring to both the summary of the invention and the detailed description, below, which describe the preferred embodiment in addition to the scope of the invention defined by the claims considered in conjunction with the accompanying drawings.

SUMMARY OF THE INVENTION

The method for forming a via hole in multiple metal layers of semiconductor device of the present invention is defined by the claims with a specific embodiment shown in the attached drawings. For the purpose of summarizing the invention, the invention relates to a method for forming a via hole by depositing a first insulating layer on a silicon substrate and forming a metal layer pattern on said first insulating layer.

Next, a second insulating layer is deposited on said metal layer pattern and a barrier layer is formed on said second insulating layer and a photoresist layer is coated on said barrier layer.

A slot is formed by etching away the determined portion of the photoresist layer and the portion of the exposed barrier layer, and the second insulating layer thereunder is eliminated to the desired depth by the plasma etching method and hence the remaining photoresist layer is removed.

Finally, a via hole is formed by etching away the remaining portion of the second insulating layer using the barrier layer as a mask, and a conductive layer is deposited over the via hole to thereby contact with said metal layer pattern.

The more pertinent and important features of the present invention have been outlined above in order that the detailed description of the invention which follows will be better understood and that the present contribution to the art can be fully appreciated. Additional features of the invention described hereinafter form the subject of the claims of the invention. Those skilled in the art can appreciate that the conception and the specific embodiment disclosed herein may be readily utilized as a basis for modifying or designing other structures for carrying out the same purposes of the present invention. Further, those skilled in the art can realize that such equivalent constructions do not depart from the spirit and scope of the invention as set forth in the claims.

BRIEF DESCRIPTION OF THE DRAWINGS

For fuller understanding of the nature and objects of the invention, reference should be had to the following detailed description taken in conjunction with the accompanying drawings in which.

The same reference numbers are used in each of the figures showing the views of the drawings.

DETAILED DESCRIPTION OF THE INVENTION

FIG. 1 through FIG. 5 illustrate the via hole forming process in multi-metal layers of the semiconductor device in accordance with the present invention.

Figure 1:
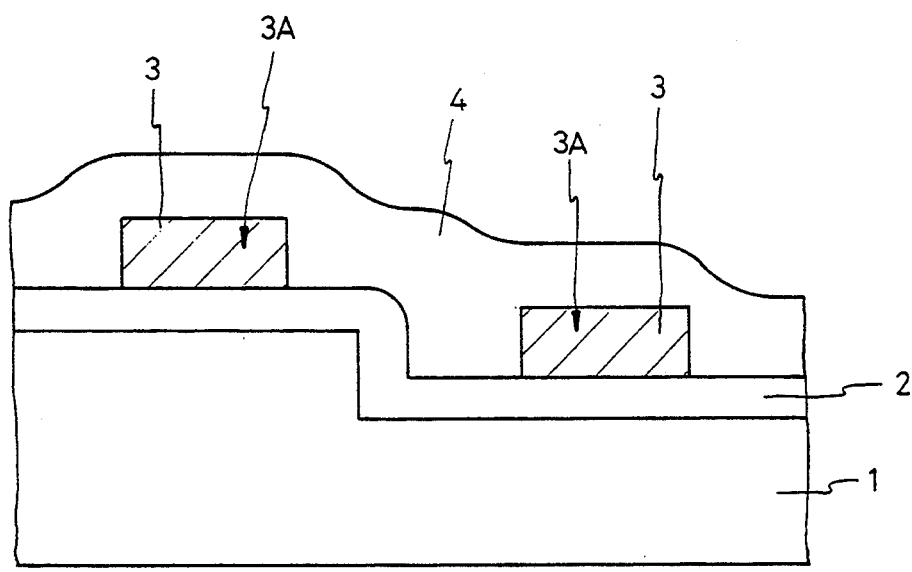
FIG. 1 illustrates a cross-sectional view of the semiconductor device in which a first insulating layer and metal pattern and second insulating layer are formed on a silicon substrate, sequentially.

As to FIG. 1, a first insulating layer 2, for example, oxide layer, is deposited on a silicon substrate having a topology.

Thereafter, a metal layer, for example, aluminium or alloy of aluminum and copper, is deposited thereon.

Next, a metal layer pattern 3A is formed by photoresistive layer (not shown) and a second insulating layer 4 is deposited on the metal layer pattern 3A for insulating with a conductive layer which will be formed later.

Figure 2:
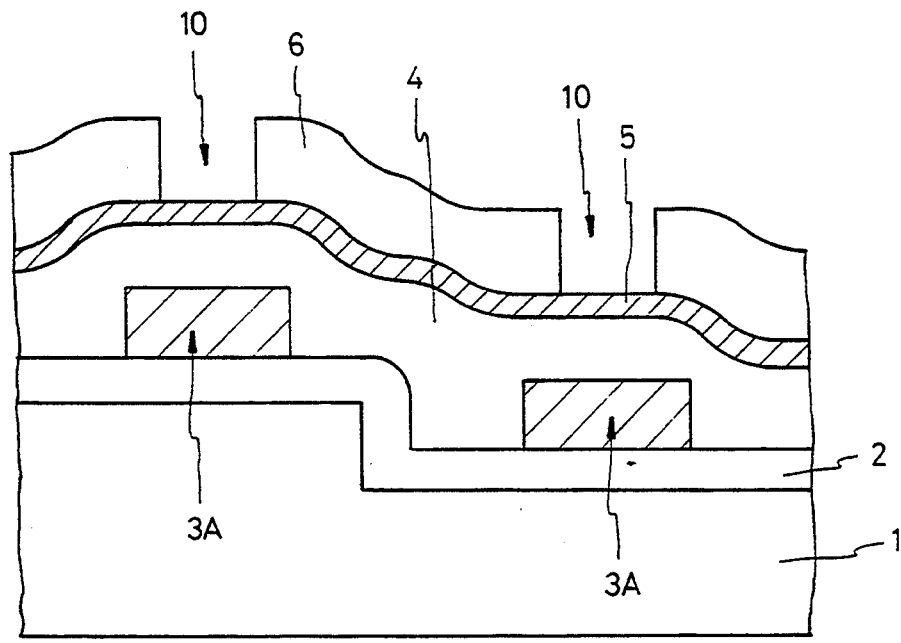
FIG. 2 illustrates a cross-sectional view of the semiconductor device in which a barrier layer and photoresistive is removed to form a slot.

As to FIG. 2, a barrier layer 5 for protecting diffusion, for example, TiN or Ti or TiW, is deposited on the second insulating layer 4 to the desired depth.

Thereafter, a photoresistive layer 6 is coated on the thin barrier layer 5 for forming a via hole which will be formed later. Next, the determined portion of the photoresistive layer 6 over the metal-layer pattern 3A is removed to thereby form a slot 10.

Figure 3:
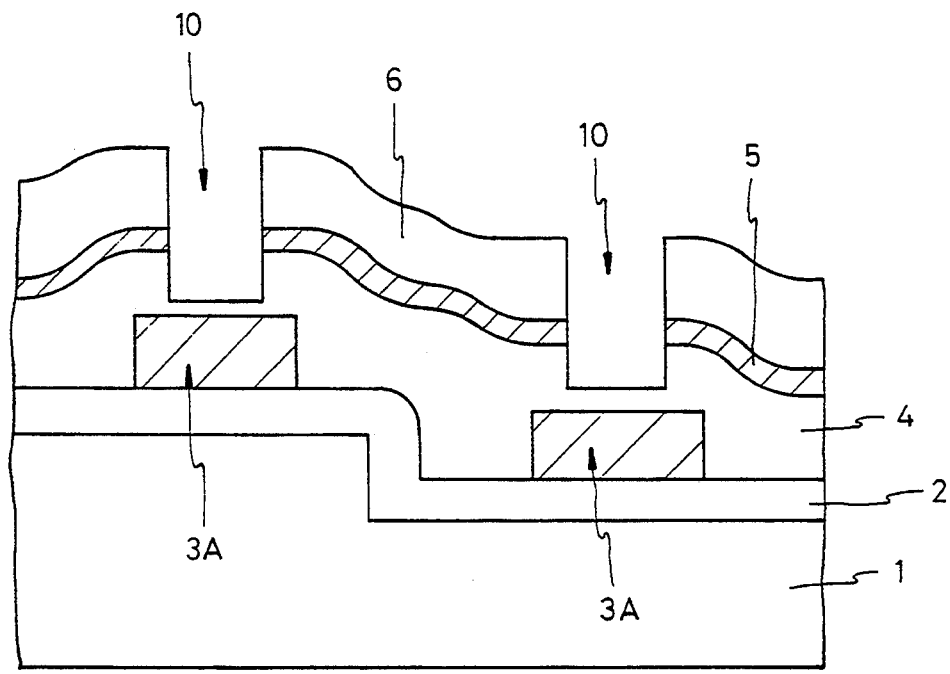
FIG. 3 illustrates a cross-sectional view of the semiconductor device in which the barrier layer and the portion of the first insulating layer are removed to desired depth.

As to FIG. 3, the barrier layer 5 exposed through the slot 10 and the determined depth of the second insulating layer 4 are removed, in which the metal layer pattern 3A is not exposed.

Figure 4:
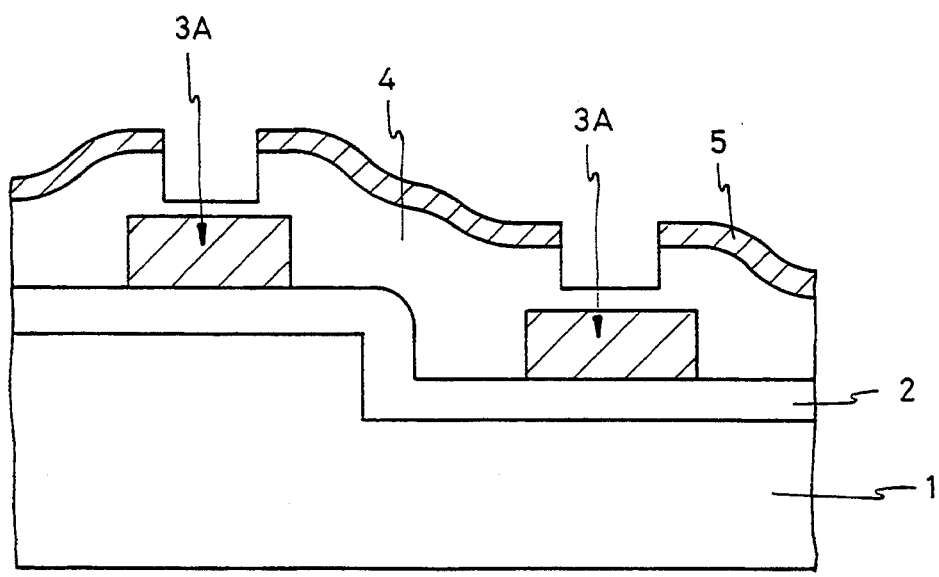
FIG. 4 illustrates a cross-sectional view of the semiconductor device in which the photoresist layer is removed.

FIG. 4 illustrates a cross-sectional view of the semiconductor device in which the photoresistive layer on the second insulating layer is removed.

Figure 5:
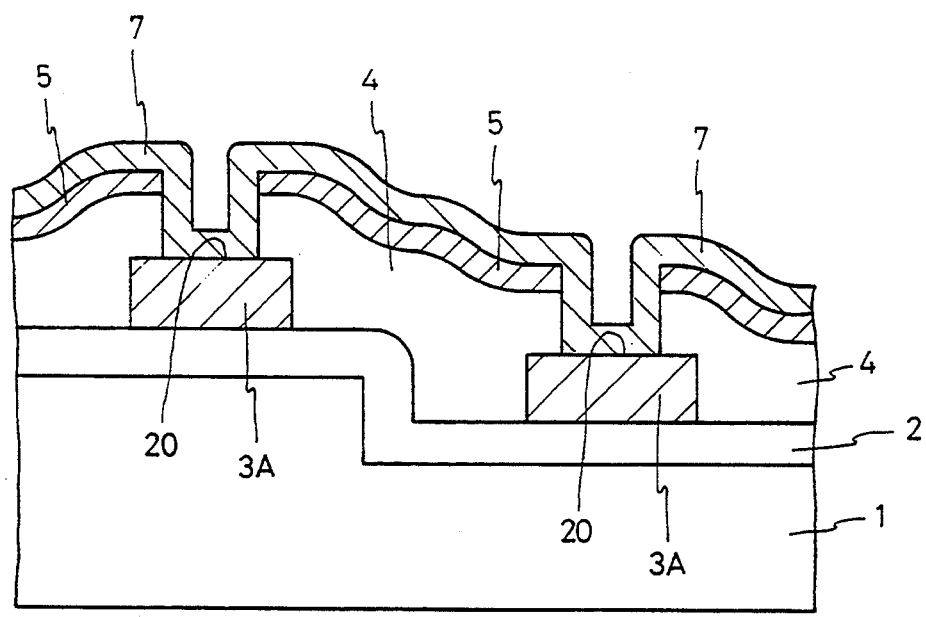
FIG. 5 illustrates a cross-sectional view of the semiconductor in which the first insulating layer remaining over the metal pattern is removed and a conductive layer is deposited over the entire structure.

As to FIG. 5, the second insulating layer 4 remaining on the metal layer pattern 3A is removed completely, using the barrier layer 5 as a mask, thereby the metal layer pattern 3A thereunder is exposed and a via hole is formed. Next, a conductive layer 7, for example, polysilicon, or aluminum or metal layer, is deposited over the entire structure. Accordingly, the conductive layer 7 will make contact, through via hole 20, with the metal layer pattern 3A thereunder.

According to the present invention, the barrier layer over the metal layer pattern is formed beneath the photoresistive layer for the via hole forming mask and the photoresistive layer is removed before exposing the metal-layer pattern by plasma etching process. The via hole is formed by using the barrier layer as a mask to thereby protect the formation of the polymer formed on the metal-layer pattern and side wall of the via hole.

Also, even though overetching occurs for manufacturing the via hole, the diffusion protecting barrier layer having a proper etching selective ratio to the second insulating layer can be a mask, and is not necessary for removing the barrier layer after the formation of the via hole.

Although this invention has been described in its preferred form with a certain degree of particularity, it is appreciated by those skilled in the art that the present disclosure of the preferred form has been made only by way of example and that numerous changes in the details of the construction, combination and arrangement of parts may be resorted to without departing from the spirit and scope of the invention.

What is claimed is:

1. A method for forming a via hole in multiple metal layers of semiconductor device, comprising the steps of:
   depositing a first insulating layer on a silicon substrate;
   forming a metal layer pattern on said first insulating layer;
   depositing a second insulating layer on said metal layer pattern;
   forming a barrier layer on said second insulating layer;
   coating a photoresist layer on said barrier layer;
   forming a slot by etching away the determined portion of the photoresist layer;
   removing the portion of the exposed barrier layer thereunder and a portion of the second insulating layer thereunder by etching wherein the remaining unetched portion of the second insulating layer covers the portion of the metal layer facing the slot to prevent exposure of the metal layer via the slot;
   removing the remaining photoresist layer;
   forming a via hole by etching away the remaining portion of the second insulating layer using said barrier layer as a mask; and
   depositing a conductive layer over said via hole to thereby contact with said metal layer pattern.

2. The method of claim 1, wherein said metal layer pattern is selected from the group consisting of aluminum, an alloy of aluminum and copper.

3. The method of claim 1, wherein said barrier layer is selected from the group consisting of TiN, Ti, and TiW.

4. A method for forming a via hole in multiple metal layers of semiconductor device, comprising the steps of:
   depositing a first insulating layer on a silicon substrate:
   forming a metal layer pattern on said first insulating layer;
   depositing a second insulating layer on said metal layer pattern;
   forming a metal barrier layer on said second insulating layer;
   coating a photoresist layer on said metal barrier layer;
   forming a slot by etching away the determined portion of the photoresist layer;
   removing the portion of the exposed barrier layer thereunder and a portion of the second insulating layer thereunder by etching wherein the remaining unetched portion of the second insulating layer covers the portion of the metal layer facing the slot to prevent exposure of the metal layer via the slot;
   removing the remaining photoresist layer;
   forming a via hole by etching away the remaining portion of the second insulating layer, using said barrier layer as a mask: and
   depositing a conductive layer over said via hole to thereby contact with said metal layer pattern.

5. The method of claim 4, wherein said metal layer pattern is selected from the group consisting of aluminum, an alloy of aluminum and copper.

6. The method of claim 4, wherein said metal barrier layer is selected from the group consisting of TiN, Ti, and TiW.

7. The method of claim 1, wherein the step of removing the portion of the exposed barrier layer and the portion of the second insulating layer thereunder is by a plasma etching method.

8. The method of claim 4, wherein the step of removing the portion of the exposed barrier layer and the portion of the second insulating layer thereunder is by a plasma etching method.

* * * * *